(12) United States Patent
Leininger et al.

(10) Patent No.: US 8,312,332 B2
(45) Date of Patent: Nov. 13, 2012

(54) DEVICE AND METHOD FOR TESTING AND FOR DIAGNOSING DIGITAL CIRCUITS

(75) Inventors: Andreas Leininger, München (DE); Michael Goessel, Mahlow (DE)

(73) Assignee: Infineon Technologies AG, Neubiberg, DE (US)

( * ) Notice: Subject to any disclaimer, the term of this patent is extended or adjusted under 35 U.S.C. 154(b) by 1226 days.

(21) Appl. No.: 11/364,369

(22) Filed: Mar. 1, 2006

(65) Prior Publication Data
US 2007/0168814 A1 Jul. 19, 2007

(30) Foreign Application Priority Data
Sep. 28, 2005 (DE) .......................... 10 2005 046 588

(51) Int. Cl.
*G01R 31/28* (2006.01)
(52) U.S. Cl. .......................... 714/732; 714/729; 714/45
(58) Field of Classification Search .................... 714/35, 714/742, 729
See application file for complete search history.

(56) References Cited

U.S. PATENT DOCUMENTS

| | | | | |
|---|---|---|---|---|
| 4,745,355 | A * | 5/1988 | Eichelberger et al. | ......... 714/728 |
| 5,612,963 | A * | 3/1997 | Koenemann et al. | ......... 714/739 |
| 5,617,531 | A * | 4/1997 | Crouch et al. | .................. 714/30 |
| 5,930,270 | A | 7/1999 | Forlenza et al. | |
| 6,021,514 | A * | 2/2000 | Koprowski | .................. 714/733 |
| 6,510,398 | B1 | 1/2003 | Kundu et al. | |
| 6,557,129 | B1 | 4/2003 | Rajski et al. | |
| 6,684,358 | B1 * | 1/2004 | Rajski et al. | ................... 714/739 |
| 6,738,939 | B2 * | 5/2004 | Udawatta et al. | ............. 714/726 |
| 6,745,359 | B2 * | 6/2004 | Nadeau-Dostie | ............. 714/726 |
| 6,807,646 | B1 * | 10/2004 | Williams et al. | ............... 714/736 |
| 2003/0097614 | A1 * | 5/2003 | Rajski et al. | ..................... 714/30 |
| 2004/0139377 | A1 * | 7/2004 | Barnhart et al. | ............... 714/726 |
| 2004/0230884 | A1 | 11/2004 | Rajski et al. | |

FOREIGN PATENT DOCUMENTS

WO    WO 2005/020075 A1    3/2005

OTHER PUBLICATIONS

Xiaoling Sun; Tutak, W.; , "Error identification and data retrieval in signature analysis based data compaction," Defect and Fault Tolerance in VLSI Systems, 1996. Proceedings., 1996 IEEE International Symposium on , vol., no., pp. 177-184, Nov. 6-8, 1996.*

(Continued)

*Primary Examiner* — Steve Nguyen
(74) *Attorney, Agent, or Firm* — Edell, Shapiro & Finnan, LLC

(57) ABSTRACT

A test apparatus includes a test input signal generator that generates a test input signal of word width N, and terminals that connect to inputs and outputs of an electrical circuit to be tested. The electrical circuit includes N digital test inputs and M digital test outputs. The terminals for the test inputs are connected to the test input signal and an electrical circuit is driven such that it outputs at its test outputs data with a macro clock cycle T of length L as test response. A compactor includes M inputs that are connected to the terminals for the test outputs of the circuit to be tested. The compactor compacts the test response with a micro clock cycle t of length l and outputs a data word of width m, where the length L is at least twice as large as the length l.

16 Claims, 8 Drawing Sheets

OTHER PUBLICATIONS

Leininger, et al., "Diagnosis of Scan-Chains by Use of a Configurable Signature Register and Error-Correcting Codes," 6 pages.

Leininger, A., et al, "Diagnosis of Scan-Chains by Use of a Configurable Signature Register and Error-Correcting Codes", *Design Automation and Test (DATE)*, Paris, 2004, pp. 1302-1307.

Gössel, M., et al. "Signature Analysis for Identifying Failing Vectors", Tagungsband des 15. Workshop der GI/ITG/GMM, "Testmethoden und Zuverlässigkeit von Schaltungen und Systemen" Mar. 2003, pp. 51-54.

Mrugalski, G. et al., "Fault Diagnosis in Designs with Convolutional Compactors." Proceedings of International Test Conference. IEEE, 2004, pp. 498-507.

Internet site—http://www.adobe.com/products/acrobat/readstep2.html vom Dec. 17, 2001.

Gerner, Manfred, et al."Selbsttest digitaler Schaltungen", München: Oldenbourg, 1990, pp. 120-124, 131-135, 140-151.

\* cited by examiner

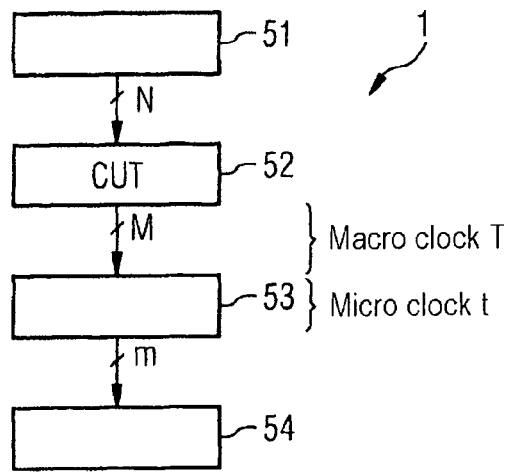
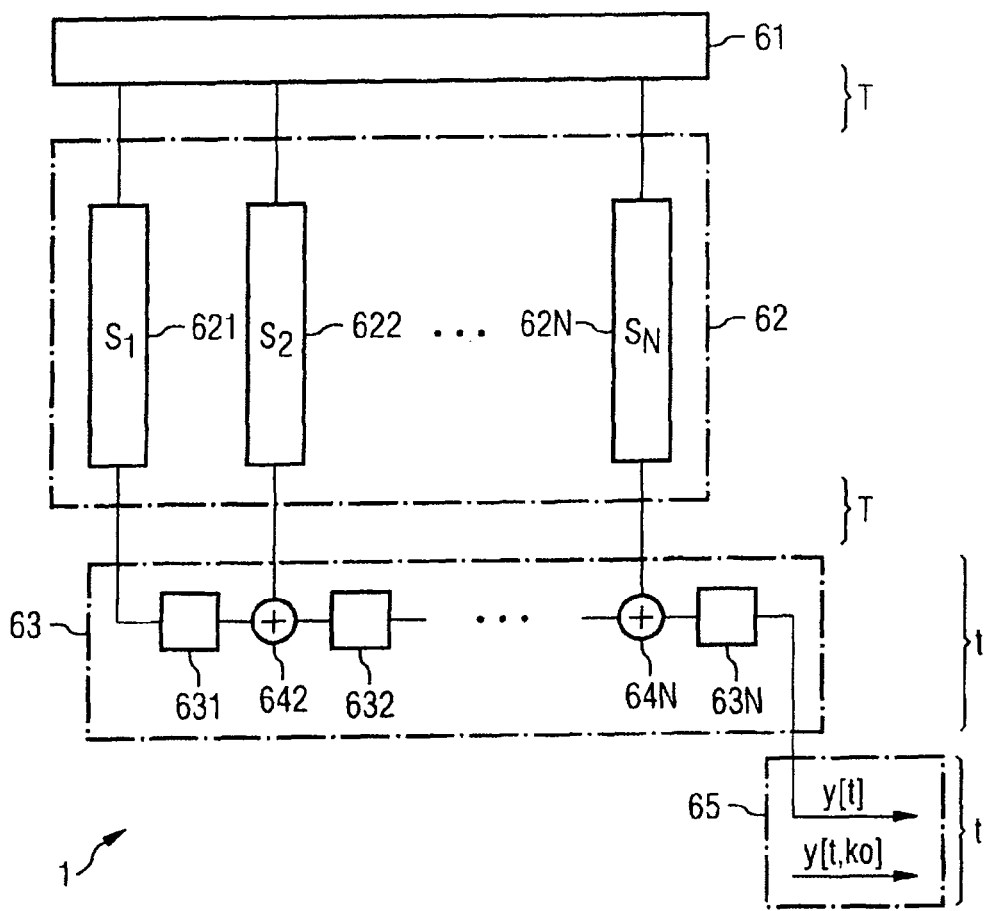

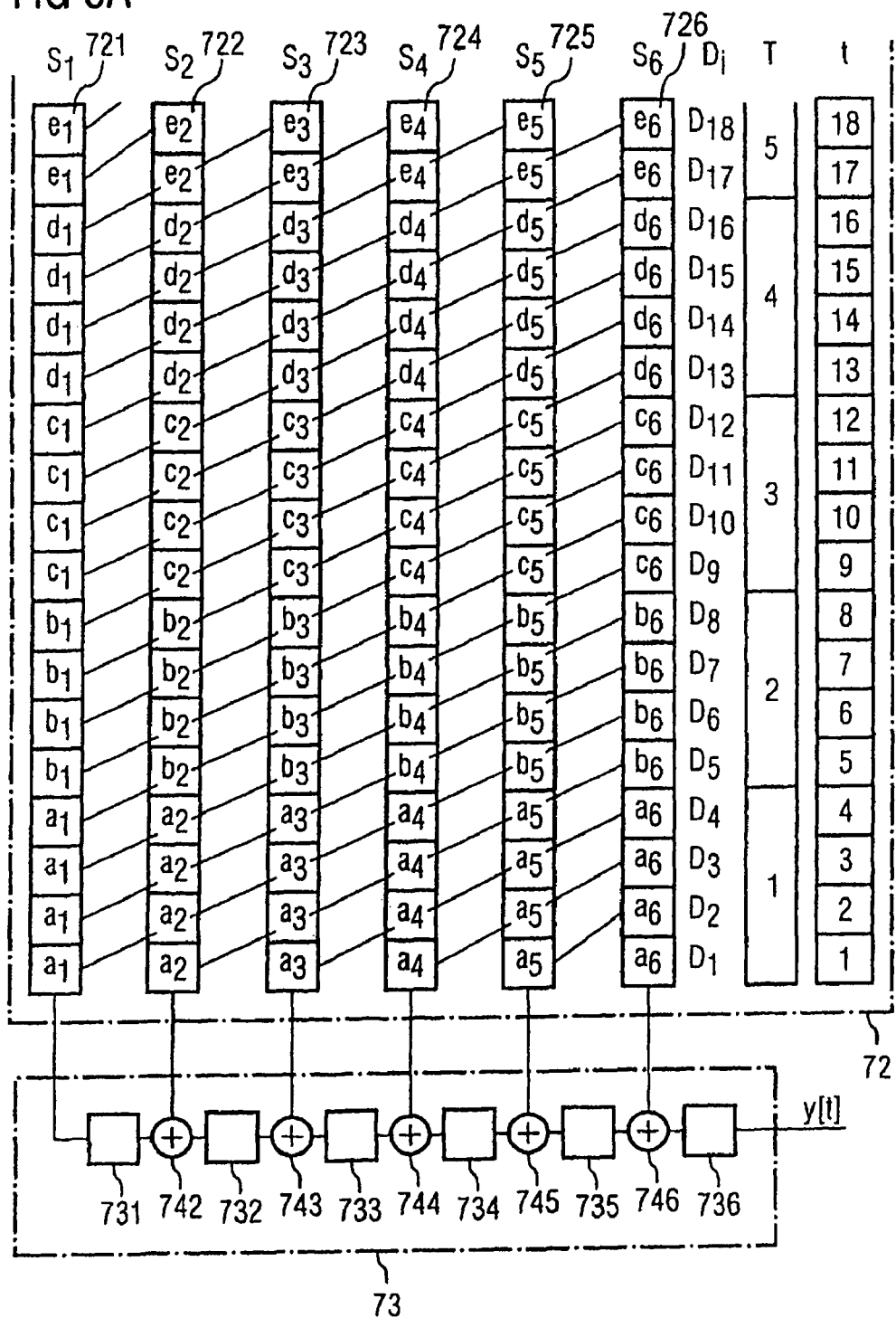

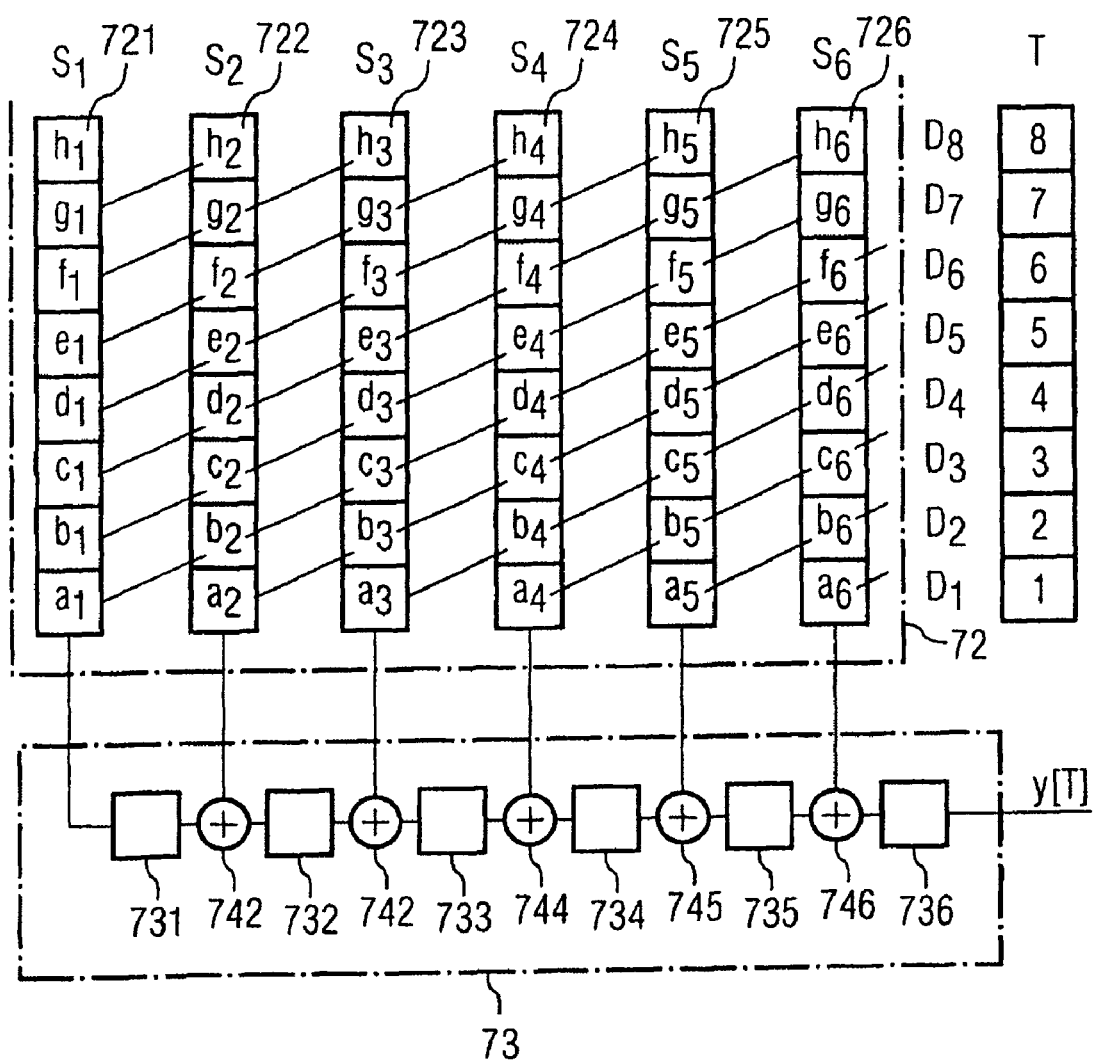

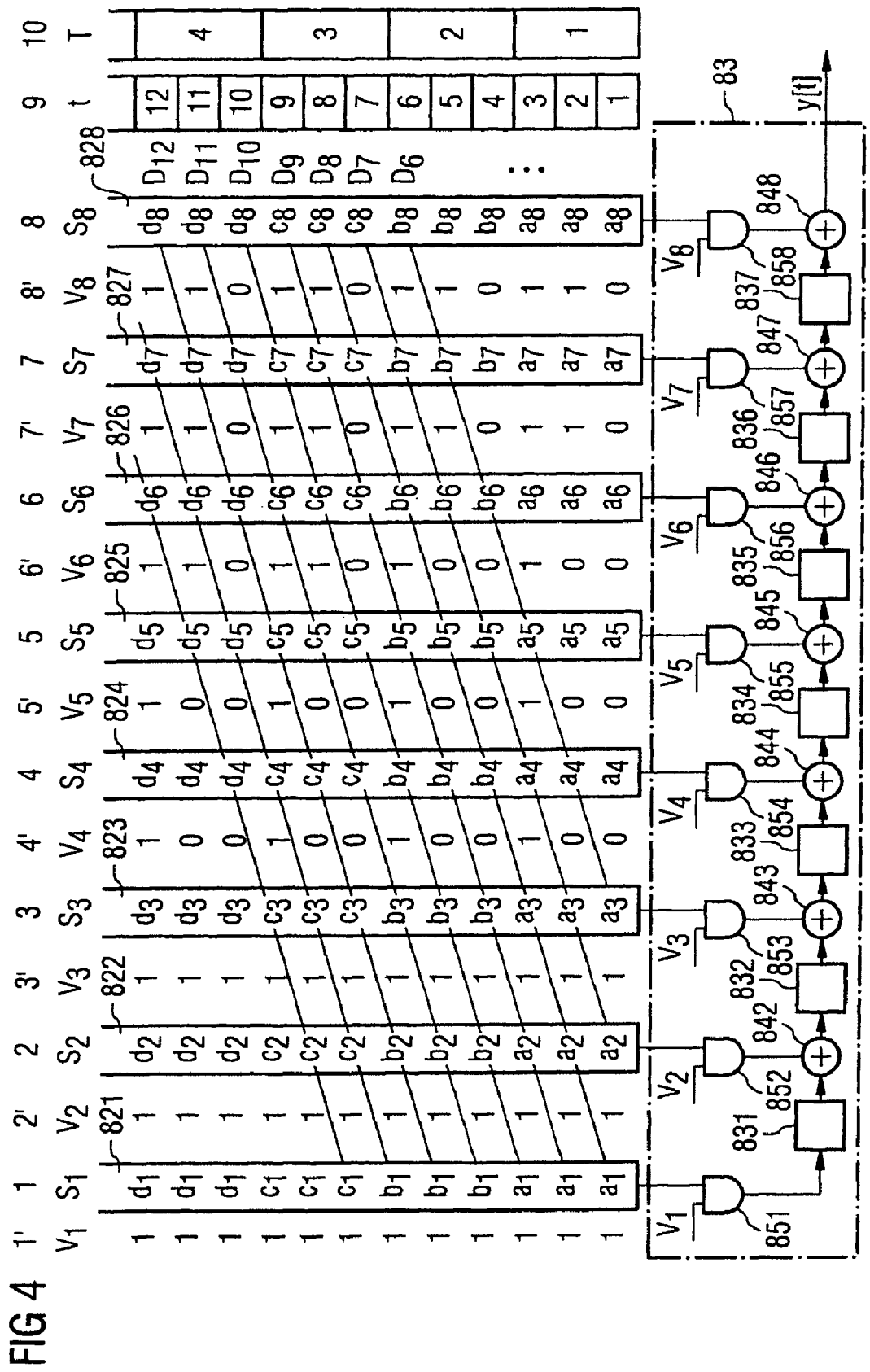

DEVICE AND METHOD FOR TESTING AND FOR DIAGNOSING DIGITAL CIRCUITS

CROSS REFERENCE TO RELATED APPLICATIONS

This application claims priority under 35 USC §119 to German Application No. DE 102005046588.9, filed on Sep. 28, 2005, and titled "Device and Method for Testing and For Diagnosing Digital Circuits," the entire contents of which are hereby incorporated by reference.

Field of the Invention

The invention relates to an apparatus and to a method for testing and for diagnosing digital circuits.

BACKGROUND

Due to the increasing degree of integration of electrical circuits and because of the errors occurring during production and in service, the expenditure for testing and diagnosing such circuits is also increasing. Complex circuits are frequently diagnosed and tested by using scan paths. In this context, the outputs of the electrical circuits also form the outputs of the scan paths. In circuits which have many outputs, there is usually a correspondingly large amount of output data which must be processed in the test. This takes a long time and requires a large amount of storage space.

In DE 103 38 922, test or diagnostic values with a word width N are input into a circuit to be tested or to be diagnosed. The circuit to be tested or to be diagnosed outputs a test response with a word width M which is compacted into test output data of word width m by a compactor, where m is smaller than M. Compactors use special linear automatons such as multi-input shift registers (MISHR) or multi-input linear feedback shift registers (MILFSR).

Within digital circuits, there are voltage nodes, the voltage levels of which are unknown. These voltage levels are called unknown values or abbreviated X values. Unknown values are produced by, for example, non-initialized registers or lines driven at high impedance. As a rule, they do not lead to a malfunction of the electrical circuit.

When output data influenced by these unknown values are compacted, however, the problem arises that these output data cannot be used for assessing the circuit. This is solved by the abovementioned DE 103 38 922 in that a multiplexer in the compactor is adjusted in such a manner that unknown values are replaced by known values. However, this increases the control and calculation effort for the compactor.

The reference "*Diagnosis of Scan-Chains by Use of Configurable Signature Registers and Error Correcting Codes*", Proceedings DATE 2004, pp. 1302-1307 by A. Leininger, M Goeseel and P. Muhmenthaler, describes how control signals can be used for a compactor in different successive runs so that in each case the syndrome values of an error-correcting code are output at the output of the compactor. By this means, faulty scan cells can be located.

U.S. Pat. Nos. 6,510,398, 5,930,270 and 20040230884 and WO 01/38889 show other test methods with compactors.

SUMMARY OF THE INVENTION

The present invention provides a test apparatus with a compactor which enables errors to be located from test responses of an electrical circuit even with little control effort.

The present invention also provides an associated method for testing and for diagnosing electrical circuits.

According to the invention, a test apparatus for an electrical circuit to be tested is provided and comprises a test input signal generator which generates a test input signal of word width N. Test input signals are also called test input. The test input signal generator can comprise a tester but can also comprise a memory for the signal data and also a test input signal generator on a chip to be tested which has the electrical circuit. However, test input signal generator can also comprise electrical lines which are connected to the terminals for connection to the inputs of the electrical circuit to be tested if test input signals are conducted via these lines.

The test apparatus also includes terminals that connect to inputs and outputs of an electrical circuit to be tested. In this context, an electrical circuit to be diagnosed is also called an electrical circuit to be tested.

During a test, it is established whether an electrical circuit meets particular test requirements. During a diagnostic analysis, it is investigated to what faults in the electrical circuit are to be attributed, for example by locating the faulty scan cell.

The electrical circuit to be tested includes N digital test inputs and M digital test outputs. The terminals for the test inputs are connected to the test input signal. The electrical circuit to be tested is driven in such a manner that it outputs at its test outputs data with a macro clock cycle T as test response. The length L of the macro clock cycle T designates the time interval between similar successive, for example rising, edges of the macro clock cycle T.

The test apparatus also includes a compactor. The compactor includes at least M inputs which are connected to the terminals for the test outputs of the circuit to be tested and are evaluated.

The compactor compacts the test response with a micro clock cycle t which has the length l. It outputs data words of width m. The width m is always smaller than the number M of the digital test outputs. The length L of the micro clock cycle is at least twice as long as the length l. In other words, k is selected as $k \geq 2$, where k is defined by $kl \leq L$. The ratio of L to l does not need to be integral and ratios of, for example, 2.5 are also conceivable.

Due to the fact that the compactor operates with the faster micro clock cycle t, more result values are available for evaluation. These additional result values can be used for specifying errors which have previously been masked by unknown values. This prevents new test runs which require a high control effort. This reduces the total duration for the test and increases the throughput.

The test method according to the invention offers further advantages over conventional prior art methods.

In the prior art, the test needs to be repeated k times for the diagnostic analysis, where k=C log 2(N) is the number of control points of the error-correcting code and C is a relatively small constant. In spite of the logarithmic data reduction, the test time is relatively high. The test data must be input k times into the circuit with scan paths to be tested by the tester, shifted out, compacted and evaluated. This test time is reduced by the device according to the invention since, due to the faster micro clock, more data are available for evaluation.

In the test mode in the prior art, an error with an even number of faulty scan cells on a diagonal is not detected. A faulty chip is not detected as faulty if it only has even-numbered errors on its diagonal. These statements apply to any MISHR architecture. As has been investigated experimentally, the probability that a faulty chip is not detected as faulty is very small. To detect a faulty chip, it is sufficient that an odd number of faulty scan cells are located at least on one diagonal and most of the faulty chips produce errors on a multiplicity of diagonals.

The probability that a specific fault is not detected and is then not correctly diagnosed in further runs is greater. If a particularly high diagnostic quality is desired, it is desirable also to detect such errors. The test apparatus according to the invention reduces the probability that errors are not detected due to the fact that a plurality of diagonals are calculated per macro clock cycle.

The output of the compactor can be connected to an evaluating device which compares signals output by the compactor with result values for an error-free circuit. The result values for the error-free circuit can be obtained, for example, by simulations.

The evaluating device can be implemented by an external tester, by additional logic in the electrical circuit to be tested or by an external circuit, for example as semiconductor component.

Due to the compacting of the test response, only a few comparisons with expected result values need to be performed, which reduces the computing effort. If the evaluating device only selects a subset of the signals output by the compactor, the computing effort is additionally reduced. For a test in which it is only determined whether test requirements are met or are not met, it is sufficient if only a subset of the signals is assessed. The evaluating device can thus be operated more slowly than the compactor. In this arrangement, for example, cheaper testers can be used as evaluating device.

The compactor is preferably a linear automaton. In such a device, the faulty scan cells can be easily inferred from the output signals of the compactor.

If the linear automaton is variable in time, the automaton can be changed when certain errors are present, in order to locate the error.

In one embodiment of the invention, the evaluating device compares only those output signals of the compactor with expected values whose value has not been influenced by unknown values (X values) in the electrical circuit to be tested. This is done by ignoring the output signals with unknown values by not sampling and assessing these output signals.

In a further embodiment of the invention, the output values of the compactor which are not evaluated are temporarily stored and evaluated in a downstream circuit if an error has occurred. The necessary data are generated and evaluated by the compactor in only one test run. For this purpose, the evaluating device selects a first part of the compacted signals generated by the compactor in the micro clock cycles of length t. These selected compacted signals or the selected signals accumulated in a signature are compared with corresponding signals or with the corresponding signals, accumulated in a signature, of the error-free circuit to be tested or to be diagnosed. A further part of the values output by the compactor is stored. If the compared values do not match, error signals are formed for test and/or diagnostic analysis. In the case of an error, the temporary memory saves another test run and thus reduces the time necessary for diagnostic analysis.

The last K compacted outputs y[t] of the compactor are preferably stored and evaluated when, during the comparison of the values output by the compactor with the corresponding correct expected compacted values, at least one error has occurred, where K is greater than or equal to 2. The comparison is made at the micro clock cycles which were determined by the evaluating device.

The compactor can contain a multi-input shift register (MISHR). Such a compactor generates from a multiplicity of input signals a sequence of output values which are a logical function of the input values. The output values have a lesser word width than the input signals.

By using a multi-input linear feedback shift register (MILFSR), input signals can be compacted into a single signature which is only a few bits wide.

As an alternative, the compactor is a convolutional compactor. Such a compactor is described in "*Fault Diagnosis in designs with convolutional compactors*" by G. Mrugalski, A. Pogiel, Rajski, J Tyszer and C. Wang in Proc. Int. Test Conf, pages 498-507, 2004.

The test apparatus is particularly suitable for electrical circuits to be tested which have scan paths. In this arrangement, at least one scan path is applied between the test inputs and the test outputs. As a rule, test input signals are shifted into the scan paths by a slow clock since the electrical circuit is not optimized for speed with respect to the scan paths. The values shifted into the scan paths are applied to the combinatorial circuit section and the test responses are stored in the scan cells. Following this, the values stored in the scan cells are shifted out again with a slow clock. According to the invention, the compactor advantageously operates with a faster micro clock. In this process, it uses the time, which is determined for shifting the test response out of the scan path by the slow macro clock, for several compaction steps in a faster micro clock.

By at least partially providing the evaluating device on a chip which contains the electrical circuit to be tested, the evaluating device can be implemented with the consumption of very little area. In addition, the expenditure for the external terminals is saved.

As an alternative, the evaluating device is at least partially implemented by an external tester. External testers can be programmed in a very variable manner so that a multiplicity of functions are available.

However, the evaluating device can also be partially implemented by a tester and partially on the chip.

The invention also relates to a method for testing and for diagnosing an electrical circuit. In a step a), a test input signal which has a word width N is generated. This test input signal is applied to an electrical circuit to be tested in a step b). Steps a) and b) can also be performed simultaneously. The electrical circuit to be tested is operated in a test mode in which the electrical circuit outputs at its test outputs data words which have a word width M as test response. The output occurs in a macro clock cycle T of length L. The length L specifies a period of time. This means that a new data word is output after a time L. The test response is compacted to form m signals in a step c), where m is smaller than M. Compacting is done at a micro clock rate t. The length l of the micro clock rate t is, at most, half as large as the length L.

The method according to the invention allows test responses to be evaluated which could not be evaluated during compaction with the macro clock cycle T because unknown values prevent the evaluation. In addition, the compacted data can be evaluated more rapidly, which reduces the overall time for the testing.

In an embodiment of the method, the compacted output signals are compared with expected values in a step d) following step c). This comparison is used for determining whether there are errors in the circuit to be tested.

The proposed method improves the testing and the diagnostic analysis mainly of circuits having a very large number of digital signal outputs, particularly having very many test data outputs which are frequently outputs of scan chains. In practice, these are approximately 1000 scan chains.

The comparison in the evaluating device can be made with a clock cycle, the length of which is greater than the length l of the micro clock cycle. This is carried out when the compacted signals for a specific test contain redundant information. This is the case, for example, if it is only tested whether there are failures and the precise locating of the errors is of no interest for the test. The comparison with only selected compacted signals reduces the required circuit and control effort.

The evaluating device can be constructed in such a manner that it only assesses those output signals of the compactor which have not been influenced by unknown values (X values) in the electrical circuit to be tested. The effort for the evaluation is reduced by ignoring the output signals whose values do not provide any information about possible errors.

In a preferred embodiment of the method, output signals of the compactor which are not compared with expected values are stored. Following that, a check is made as to whether an error has occurred during the comparison. If errors have occurred, the stored values are used for calculating the cause of the error in a further step. This method allows the cause of the error to be found with only little additional expenditure of test time.

In another embodiment of the invention, a computer program is provided for running in a test apparatus that executes a method for testing an electrical circuit, which is constructed in such a manner that the preceding method steps can be executed. The computer program contains, for example, instructions for driving the test input signal generator, the control or clock inputs of the compactor or the evaluating device. The computer program can be contained on a data carrier or a storage medium, particularly in a computer memory or in a random access memory or be transmitted on an electrical carrier signal.

In accordance with a further embodiment of the invention, a method is provided in which a computer program according to the invention is downloaded from an electronic data network, such as, for example, the Internet, to a computer connected to the data network.

In still another embodiment of the invention, method for designing a circuit for a test apparatus is provided, in which a compactor is first generated. A macro clock cycle and a micro clock cycle are generated synchronized. The macro clock cycle can be derived from the micro clock cycle or the micro clock cycle can be derived from the macro clock cycle or both can be derived from a third clock cycle. The compactor receives at its inputs test responses in the macro clock cycle t of length L and processes them in the micro clock cycle t of length l, where L is at least twice as large as l.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 schematically depicts a test apparatus according to the invention.

FIG. 2 depicts further details of the test apparatus of FIG. 1.

FIG. 3A illustrates the operation of the test apparatus of FIG. 2.

FIG. 3B illustrates the operation of a test apparatus in which the compactor is clocked more slowly than in a method according to the invention as set forth in FIG. 3A.

FIG. 4 depicts another embodiment of a test apparatus according to the invention with a time-variant automaton as compactor.

DETAILED DESCRIPTION

Figure 5:
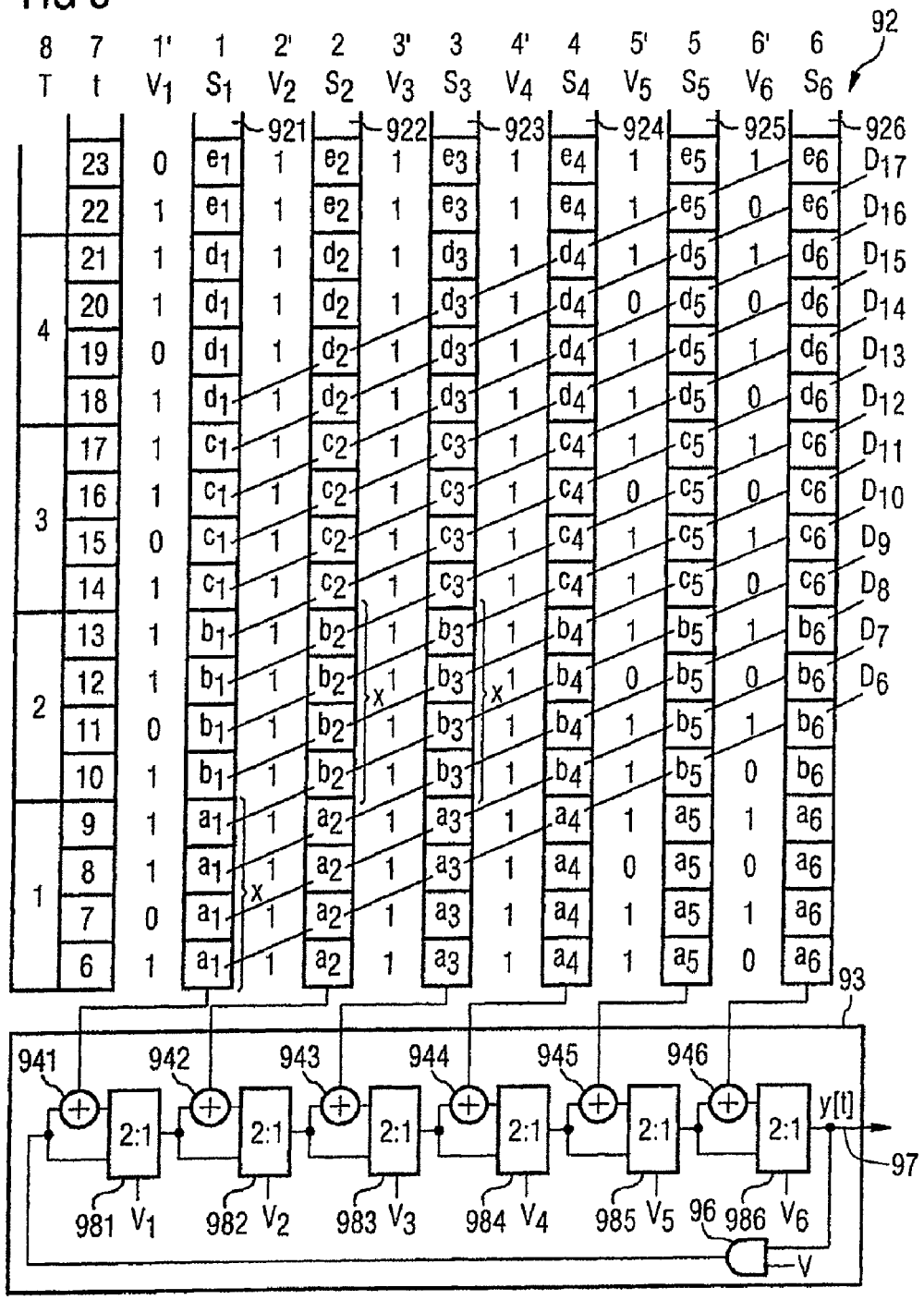
FIG. 5 depicts a further embodiment of a test apparatus according to the invention.

FIG. 1 shows a basic configuration of a test apparatus according to the invention for testing and for diagnosing a circuit to be tested or to be diagnosed. The test apparatus 1 includes a test input signal generator (TIG) 51, a circuit 52 to be tested or to be diagnosed, a compactor 53 and an evaluating device 54.

In this configuration, the TIG 51 can be implemented by an external tester or by a circuit on the chip. The test input signal generator 51 provides the test input signals of word width N and inputs them into the circuit 52 to be tested or to be diagnosed, also called CUT 52.

The CUT 52 outputs the test and diagnostic responses of word width M in the test and diagnostic clock cycle T. The test and diagnostic clock cycle T is also called macro clock cycle.

The test and diagnostic data output by the CUT 52 in the macro clock cycles T are compacted by the compactor 53 in a faster micro clock cycle t to form a signal of word width m, a macro clock cycle T containing at least 2 micro clock cycles t, where m is smaller than M.

The evaluating device 54 is used for signal selection and for comparison. It selects a subset of the signals generated by the compactor in the micro clock cycles t. In a first embodiment, the selected signals are directly compared with the corresponding signals of an error-free circuit. In a second embodiment, the selected signals are accumulated in a signature and compared in the form accumulated as signature with a corresponding signature of an error-free circuit.

If the comparisons result in differences between the selected values and values of an error-free circuit, these differences indicate faults and can be evaluated for the diagnostic analysis of faulty scan cells.

The evaluating device 54 can be implemented in an external tester or in a circuit section on the chip. It is also possible for it to be partially implemented on the chip and partially by an external tester.

The compactors 53 used are preferably various linear automatons such as linear multi-input shift registers with and without feedback (MISHRs and MILFSRs), definitive linear automatons without feedback, sometimes called convolutional compactors on the basis of convolutional codes, and others.

FIG. 2 shows an embodiment of the test apparatus of FIG. 1, where the reference symbols 6x, where x is a number, designate the same components as reference symbols 5x in FIG. 1. In the subsequent FIGS. 3, 4 etc., the same components are then designated by 7x (for FIGS. 3A and 3B), 8x (for FIG. 4), etc.

The circuit of FIG. 2 includes a test input signal generator 61, a circuit 62 to be tested or to be diagnosed, which includes N scan paths $S_1$ 621, ..., $S_N$ 62N, a compactor 63 and an evaluating device 65 which is implemented by an external tester.

For the sake of simplicity, it is assumed here that all scan paths consist of in each case Lae scan cells, where Lae is a natural number. The test input signal generator TIG 61 generates the required test and diagnostic input signals of word width N which are shifted into the N scan paths $S_1$ 621, $S_2$ 622, ..., $S_n$ 62N in Lae clock cycles T.

The compactor 63 contains N flip-flops 631, ..., 63N and N−1 XOR gates 642, ..., 64N. The output of the scan path $S_1$ 621 is connected to the input of the flip-flop 631. In this exemplary embodiment, the word width N is equal to the width of the test response M and the compactor 63 outputs an output signal of width m equal to 1.

For all i=2, ..., N, the output of the scan path $S_i$ is connected to the first input of the XOR element 64*i*, the output of which, in turn, is connected to the input of the flip-flop 63*i*. For all j=2, ..., N−1, the output of the flip-flop 63*j* is connected to the second input of the XOR element 64*j*+1.

The output of the flip-flop 63N, which carries the compacted 1-bit-wide signal y[t], is the output of the compactor 63. This output is connected to the evaluating device 65. In this evaluating device 65, the compacted signal y[t] is compared with the correct expected values y[t,ko], possibly determined by simulation, in selected micro clock cycles t.

The test input signal generator TIG 61 generates the test input signals of word width N for the circuit CUT 62 to be tested or to be diagnosed, which is a circuit with N scan paths $S_1$ 621, ..., $S_N$ 62N. The TIG 61 generates the test data in the macro clock cycle of length L, the test input signals are shifted into and out of the scan paths in macro clock cycles of length L. In FIG. 2, this is illustrated by the fact that the macro clock cycle T is pointed out at the inputs and at the outputs of the scan paths. The test input signals shifted into the scan paths are applied to the combinatorial circuit section of the circuit CUT to be tested or to be diagnosed, frequently at the system clock rate, and the test responses stored in the scan cells are shifted out in macro clock cycles while the subsequent test input signals are also shifted in macro clock cycles T. Thus, it is frequently not possible to specify a uniform clock rate for the operation of the scan cells in the scan paths.

The test responses output by the combinatorial circuit section are stored in the storage cells of the scan paths $S_1$ 621, ..., $S_N$ 62N. The storage cells of the scan chains contain, for example, flip-flops.

The stored test responses are then shifted out of the scan paths in Lae clock cycles T while, at the same time, the new test input signals are generated by the test input signal generator TIG 21 and shifted into the scan paths $S_1$ 621, ..., $S_N$ 62N. The combinatorial circuit section of the CUT 62 is not drawn in FIG. 2.

The test responses shifted out are compacted in a linear compactor to form a signature which in this case consists of the values y[1], y[2] etc., output by the MISHR. A faulty signature will indicate a fault in the circuit.

The compactor 63 is an MISHR (Multi-Input Shift Register) of N storage elements. This MISHR operates at the micro clock rate t and outputs at its output 64 a compacted signal y[t] in each micro clock cycle t. The evaluating device 65 selects compacted signal values y[t] at certain times and compares these selected signal values with the corresponding correct signal values y[t,ko] of a correct circuit to be tested and to be diagnosed.

The evaluating device 65 is implemented here by an external tester. The tester 65 provides correct comparison signals y[t,ko] for selected micro clock cycles t and compares them with the corresponding compacted signal output by the tester in the selected micro clock cycles.

To illustrate the operation and the advantages of the circuit according to the invention of FIG. 2, FIG. 3A shows a section of a circuit to be tested or to be diagnosed with 6 scan paths $S_1$ 721, ..., $S_6$ 726 with the downstream compactor 73. As in FIG. 2, the scan paths of FIG. 3A in each case output one value in each macro clock cycle T.

The compactor 73 is constructed in the following manner. The output of the scan path $S_1$ 721 is connected to the input of the flip-flop 731. For i=2, ..., 6, the output of the scan path $S_i$ 72*i* is connected to the first input of the XOR element 74*i*, the output of which is connected to the input of the flip-flop 73*i*. For j=2, ..., 5, the output of the flip-flop 73*j* is connected to the second input of the XOR element 74*j*+1. The output of the flip-flop 736, which carries the compacted signal y[t], is the output of the compactor. This output is conducted into an evaluating device which compares y[t] with the correct expected values, possibly determined by simulation, in selected micro clock cycles t.

The content of the flip-flop 73*i* in micro clock cycle t is designated by zi(t) and the value output by scan path 72*i* in micro clock cycle t is designated by $S_i(t)$; the following then applies:

$$z_1(t+1) = S_1(t)$$

$$z_i(t+1) = z_{i-1}(t) \oplus S_i(t) \text{ for } i=2, \ldots, 6$$

$$y[t] = z_6(t).$$

It can be seen that the compactor 73 is a linear automaton of the general form $$z[t+1] = Az[t] \oplus BS[t]$$

$$y[t] = C_z[t] \oplus DS[t]$$

where $$A = \begin{pmatrix} 000000 \\ 100000 \\ 010000 \\ 001000 \\ 000100 \\ 000010 \end{pmatrix}$$

$$B = (1, 1, 1, 1, 1, 1),$$

$$C = (0, 0, 0, 0, 0, 1),$$

$$D = 0,$$

$$z(t) = [z_1(t), \ldots, z_6(t)] \text{ and}$$

$$S(t) = [S_1(t), \ldots, S_6(t)],$$

where $z(t)$ and $S(t)$ are column vectors.

The compactor 73 operates in a micro clock cycle t of length l, 4 micro clock cycles t in each case corresponding to one macro clock cycle T. Thus, macro clock cycle 1 consists of micro clock cycles 1, 2, 3, 4, macro clock cycle 2 consists of micro clock cycles 5, 6, 7, 8, macro clock cycle 3 consists of micro clock cycles 9, 10, 11, 12, etc.

In the successive micro clock cycles t=1, 2, 3, ... the compacted output signal y[t] of the compactor 73 is in each case equal to the XOR sum of the data located on the "diagonals" $D_i$, stored in the scan paths. The diagonals $D_i$ are drawn in column $D_i$ in FIG. 3.

In FIG. 3A, kl=L, with k=4, so that in each case four micro clock cycles correspond to one macro clock cycle. In macro clock cycles T=1,2,3,4,5, the scan path $S_i$ 72*i* outputs the values $a_i, b_i, c_i, d_i, e_i$ for i=1, ..., 6. Since one macro clock cycle contains four micro clock cycles, the scan path $S_i$ outputs the values $a_i,a_i,a_i,a_i,b_i,b_i,b_i,b_i,c_i,c_i,c_i,c_i,d_i,d_i,d_i,d_i,e_i$ in sixteen micro clock cycles $1, 2, \ldots, 16$ which correspond to the four macro clock cycles $1,2,3,4$.

In FIG. 3A, each stored value is entered 4 times per macro clock cycle in each scan path in order to illustrate that each value shifted out of a scan path is in each case available for four micro clock cycles.

For the output signals y[t] of the compactor 73, the following then applies in the successive micro clock cycles:

$D_1: y[1]=a_6$ $D_2: y[2]=a_5 \oplus a_6$ $D_3: y[3]=a_4 \oplus a_5 \oplus a_6$ $D_4: y[4]=a_3 \oplus a_4 \oplus a_5 \oplus a_6$ $D_5: y[5]=a_2 \oplus a_3 \oplus a_4 \oplus a_5 \oplus b_6$ $D_6: y[6]=\oplus a_1 \oplus a_2 \oplus a_3 \oplus a_4 \oplus b_5 \oplus b_6$ $D_7: y[7]=a_1 \oplus a_2 \oplus a_3 \oplus b_4 \oplus b_5 \oplus b_6$ $D_8: y[8]=a_1 \oplus a_2 \oplus b_3 \oplus b_4 \oplus b_5 \oplus b_6$ $D_9: y[9]=a_1 \oplus b_2 \oplus b_3 \oplus b_4 \oplus b_5 \oplus c_6$ $D_{10}: y[10]=b_1 \oplus b_2 \oplus b_3 \oplus b_4 \oplus c_5 \oplus c_6$ $D_{11}: y[11]=b_1 \oplus b_2 \oplus b_3 \oplus c_4 \oplus c_5 \oplus c_6$ $D_{12}: y[12]=b_1 \oplus b_2 \oplus c_3 \oplus c_4 \oplus c_5 \oplus c_6$ $D_{13}: y[13]=b_1 \oplus c_2 \oplus c_3 \oplus c_4 \oplus c_5 \oplus d_6$ $D_{14}: y[14]=c_1 \oplus c_2 \oplus c_3 \oplus c_4 \oplus d_5 \oplus d_6$ $D_{15}: y[15]=c_1 \oplus c_2 \oplus c_3 \oplus d_4 \oplus d_5 \oplus d_6$ $D_{16}: y[16]1=c_1 \oplus c_2 \oplus d_3 \oplus d_4 \oplus d_5 \oplus d_6$.

Surprisingly, a considerable improvement in the treatment of X values is now obtained in comparison with the case where the tester and the output of the test response are performed in the same macro clock cycle T, due to the faster operation of the compactor 73 in the micro clock cycle t and due to the possibility of the tester selecting the micro clock cycles in which the compacted value y[t] output by the compactor is compared with a correct comparison value y[t,ko] provided by the tester.

In electrical circuits, indeterminate values, which are also called X values, frequently occur during the test or during the diagnostic analysis. Indeterminate values occur, for example, due to non-initialized flip-flops, with certain constellations in tristate buffers, and other cases. If an X value occurs, the circuit is not faulty and should not be detected as faulty and separated out. It is known at which time in which scan path an indeterminate value, an X value, occurs in the test applied.

It is assumed that the value $b_2$ in scan path $S_2$ is indeterminate, i.e. that $b_2=X$ applies.

Then, y[9], y[10], y[11] and y[12] cannot be used for fault detection since the corresponding XOR sums of the memory contents of the diagonals $D_9$, $D_{10}$, $D_{11}$ and $D_{12}$ contain the indeterminate value $b_2=X$. Thus, e.g.:

$y[9]=a_1 \oplus X \oplus b_3 \oplus b_4 \oplus b_5 \oplus c_6$ and a possible error in the values $a_1$, $b_3$, $b_4$, $b_5$, $c_6$ cannot be detected by y[9].

However, any error in the values $a_1$, $b_3$, $b_4$ and $b_5$ and additionally in $a_2$ and $b_6$ can be detected by:

$y[8]=a_1 \oplus a_2 \oplus b_3 \oplus b_4 \oplus b_5 \oplus b_6$ so that the tester selects y[8] for comparison with y[8,ko].

Correspondingly, because:

$y[12]=b_1 \oplus b_2 \oplus c_3 \oplus c_4 \oplus c_5 \oplus c_6$ a single error in the values $b_1,c_3,c_4,c_5,c_6$ cannot be detected by y[12]. However, by comparing y[13] with y[13,ko]:

$y[13]=b_1 \oplus c_2 \oplus c_3 \oplus c_4 \oplus c_5 \oplus d_6$ can be used for detecting a single error in $b_1,c_3,c_4$ or $c_5$ so that the tester will select y[13] for comparison with y[13,ko].

It is only the error which disturbs $c_6$ to $\bar{c}_6$ which cannot be detected if $b_2=X$ applies. The possibilities of fault detection for faulty memory values are unexpectedly improved by the faster clock rate and the selection of the corresponding outputs of the compactor, to be compared, by the tester.

This is illustrated by the comparison with an evaluation at times which are spaced apart by L, the length of the macro clock cycle T.

FIG. 3B shows a compactor in which both the scan paths and the compactor are operated in a macro clock cycle T. For this embodiment, the contents of the scan paths at macro clock cycles T1 to 8 are drawn in the scan paths 721, 722, ... 726 of the CUT 72. The compactor 73 is also operated at the macro clock rate T, which is disadvantageous. The compacted data y[Tg] indicate the values of the diagonals $D_{Ti}$ at times T1 to 8.

$D_{T1}: y[1]=a_6$ $D_{T2}: y[2]=a_5 \oplus b_6$ $D_{T3}: y[3]=a_4 \oplus b_5 \oplus c_6$ $D_{T4}: y[4]=a_3 \oplus b_4 \oplus c_5 \oplus d_6$ $D_{T5}: y[5]=a_2 \oplus b_3 \oplus c_4 \oplus d_5 \oplus e_6$ $D_{T6}: y[6]=a_1 \oplus b_2 \oplus c_3 \oplus d_4 \oplus e_5 \oplus f_6$ $D_{T7}: y[7]=b_1 \oplus c_2 \oplus d_3 \oplus e_4 \oplus f_5 \oplus g_6$ $D_{T8}: y[8]=c_1 \oplus d_2 \oplus e_3 \oplus f_4 \oplus g_5 \oplus h_6$

.
.
.

If, then, e.g. the value $c_3$ is disturbed in such a manner that it contains the inverted signal $\bar{c}_3$, this error is detected by the fact that:

$y[6]=a_1 \oplus b_2 \oplus \bar{c}_3 \oplus d_4 \oplus e_5 \oplus f_6 \neq y[6,ko]=a_1 \oplus b_2 \oplus c_3 \oplus d_4 \oplus e_5 \oplus f_6$.

For example, let the value $b_2$ be an indeterminate value X. The following then applies:

$y[6]=a_1 \oplus (b_2 X) \oplus c_3 \oplus d_4 \oplus e_5 \oplus f_6$, and since the value $b_2=X$ is indeterminate, either 0 or 1, y[6] is also indeterminate. All 5 storage cells of the scan paths $S_1$ 721, $S_3$ 723, $S_4$ 724, $S_5$ 725, $S_6$ 726, which are located on the diagonal $D_{T6}$ and which carry the values $a_1,c_3,d_4,e_5,f_6$, can then no longer be detected as faulty, which is disadvantageous. This applies even when it is only intended to detect single errors.

To further illustrate the invention, FIG. 4 shows a test apparatus with eight scan paths 821, ..., 828 and a compactor 83. The compactor 83 is built up from 7 flip-flops 831, ..., 837, 8 controlled AND gates 851, ..., 858 and 7 XOR gates 842, ..., 848.

The output of the scan path $S_1$ 821 is connected to the first input of the AND gate 851, at the second input of which the control signal $v_1$ is present and the output of which is connected to the data input of the flip-flop 831.

For i=2, ..., 7, the output of the scan path 82$i$ is connected to the first input of the AND gate 85$i$, at the second input of which the control signal $v_i$ is present. The output of the AND gate 85$i$ is connected to the first input of the XOR gate 85$i$, the second input of which is connected to the output of the flip-flop 83 (i−1). The output of the XOR gate 84$i$ is connected to the data input of the flip-flop 84$i$.

The test responses shifted out are input into the compactor 83 and processed. The compactor 83 includes an MILFSR, the inputs of which are conducted via controlled AND gates 851, ..., 85N with the respective control signals $v_1, ..., v_N$.

The output of the scan path $S_8$ 828 is connected to the first input of the AND gate 858, at the second input of which the control signal $v_8$ is present. The output of the AND gate 858 is connected to the first input of the XOR gate 848, at the second input of which the output of flip-flop 837 is present. The output of the XOR gate 848 is connected to the output of the compactor which carries the compacted output signal y[t].

If, for i=1, ..., 8, the content of flip-flop 83$i$ is designated by $z_i(t)$ and the value output by the scan path 82$i$ is designated by $S_i(t)$ at time t, the following applies:

$$Z_1(t+1) = c_1(t)S_1(t)$$

$$z_i(t+1) = c_1(t+1) \oplus z_{i-1} \text{ for } i=2, ..., 7$$

$$y[t] = z_7(t) \oplus c_8(t).$$

It can be seen that the compactor 83 is a linear, time-variable automaton of the general form:

$$z[t+1] = Az[t] \oplus B(t)S[t]$$

$$y[t] = Cz[t] \oplus D(t)S[t]$$

where:

$$A = \begin{pmatrix} 0000000 \\ 1000000 \\ 0100000 \\ 0010000 \\ 0001000 \\ 0000100 \\ 0000010 \end{pmatrix}$$

$B(t) = (c_1(t), c_2(t), c_3(t), c_4(t), c_5(t), c_6(t), c_7(t)),$ $C = (0, 0, 0, 0, 0, 0, 1),$ $D(t) = (0, 0, 0, 0, 0, 0, 0, c_7(t)),$ $z(t) = [z_1(t), ..., z_7(t)]$ and $S(t) = [s_1(t), ..., s_7(t)],$ where $z(t)$ and $S(t)$ are column vectors.

The matrixes B(t) and D(t) are time-dependent matrixes. For this reason, the linear automaton is also time-dependent.

In FIG. 4, kl=L applies, with k=3, so that in each case three micro clock cycles correspond to one macro clock cycle. In macro clock cycles T=1,2,3,4, the scan path $S_i$ outputs the values $a_i, b_i, c_i, d_i$ for i=1, ..., 8. The scan path $S_i$ outputs the values $a_i, a_i, a_i, b_i, b_i, b_i, c_i, c_i, c_i, d_i, d_i, d_i$ in twelve micro clock cycles 1, 2, ..., 12, which correspond to the 4 macro clock cycles 1,2,3,4. This is illustrated in FIG. 4 in such a manner that each stored value is entered 3 times in each scan path in order to make it clear that each value shifted out of a scan path is available for in each case three micro clock cycles at the output of the scan path.

In column j', j'=1, ..., 8 of FIG. 4, the value of the control signal $v_j(t)$ for the corresponding micro clock cycle t is specified.

It can be seen that the following applies for the output y[t] of the compactor 83, taking into consideration the values of the control signals of FIG. 4:

.
.
.

$D_6$: $y[6] = a_3 \oplus a_5 \oplus b_7 \oplus b_8$ $D_7$: $y[7] = a_2 \oplus a_3 \oplus a_4 \oplus b_7$ $D_8$: $y[8] = a_1 \oplus a_2 \oplus a_3 \oplus b_6 \oplus c_8$ $D_9$: $y[9] = a_1 \oplus a_2 \oplus b_3 \oplus b_5 \oplus c_7 \oplus c_8$ $D_{10}$: $y[10] = a_1 \oplus b_2 \oplus b_3 \oplus b_4 \oplus c_6 \oplus c_7$ $D_{11}$: $y[11] = b_1 \oplus b_2 \oplus b_3 \oplus c_6 \oplus d_8$ $D_{12}$: $y[12] = b_1 \oplus b_2 \oplus c_3 \oplus c_5 \oplus d_7 \oplus d_8$

.
.
.

The values for the output signals y[t] of the compactor are obtained as XOR sum of the contents, multiplied by the respective control signals, of the storage cells which are in each case located on a corresponding "diagonal" $D_i$. The diagonals $D_6$ to $D_{12}$ are also entered.

If then each output y[t] of the compactor, output in one micro clock cycle t, is compared with a correct value y[t,ko] provided by the tester, each individual error can be unambiguously located. Each individual error in the occupancy of a storage cell in a scan path leads to a different error pattern for t=1,2,3, ... during the comparison of y[t] and y[t,ko].

Thus, the error which disturbs $a_1$ to become $\bar{a}_1$ leads to y[8]≠y[8,ko], y[9]≠y[9,ko], y[10]≠y[10,ko] and to y[t]=y[t, ko] for t≠8,9,10, or, y[8]⊕y[8,ko]=1, y[9]⊕y[9,ko]=1, y[10] ⊕y[10,ko]=1 and y[t]⊕y[t,ko]=0 for t≠8,9,10. The reason for this is that the value of $a_1$ is precisely absorbed in the formation of the values for y[8], y[9] and y[10] in the diagonals $D_8$, $D_9$ and $D_{10}$.

The error which disturbs $a_2$ to become $\bar{a}_2$ leads to: y[7]⊕y[7,c]=1, y[8]⊕y[8,c]=1, y[9]⊕y[,c]=1 and to y[t]⊕y [t,c]=0 for t≠7,8,9 since the value $a_2$ is precisely absorbed in the formation of the values y[7], y[8] and y[9].

The error which disturbs $b_5$ to become $\bar{b}_5$ leads to y[9]⊕y [9,c]=1 and y[t]⊕y[t,c]=0 for t≠9, since $b_5$ is only absorbed in the formation of the value for y[9].

It can be noticed, most simply by checking directly, that each individual error really leads to a separate error pattern when the values y[t] and y[t,ko] are compared and can thus be unambiguously located or diagnosed by this error pattern. It can be seen that the control signals $v_i$, for i=1, ..., 8, are either constant ($v_1, v_2, v_3$) or periodic with the period k=3 ($v_4, v_5, v_6$, $v_7$), which allows an advantageously simple implementation of the generation of the control signals, for example by a modulo-k counter and a ROM.

For each individual error of a value in a macro clock cycle or in three micro clock cycles of a scan cell, a separate error syndrome is produced at the outputs of the compactor.

Since a separate different error syndrome is allocated to each individual error, a syndrome not equal to zero is allocated to each 2-bit error as XOR sum of two different syndromes. In the example, a few 3-bit errors can cancel in their syndrome. This can be avoided by a different choice of code.

The control signals $v_1, \ldots, v_N$ at the AND gates $851, \ldots, 85N$ can be operated at the faster micro clock rate t.

The compactor is operated at the fast micro clock rate t and the control signals $v_1, \ldots, v_N$, are selected in such a manner that a required high test resolution is achieved. Particularly during operation with disconnected feedback, and in the case of an error indicated in the test, the control signals are selected in such a manner that the error can be diagnosed immediately without having to enlarge the output word width of the compactor and without the test input generator or tester again having to input the test input signals into the circuit to be tested.

The coefficients of the control logic can be selected in accordance with the coefficients of the syndrome equations of a linear error-correcting code. If, e.g., the micro clock t is k times faster than the macro clock T, T=k*t, the test data output by the scan paths are available in k micro clock cycles and, by choosing k different n tuples for the n control signals $v_1, \ldots, v_N$, can be output sequentially in k micro clock cycles or one macro clock cycle as k different linear combinations at the output of the linear compactor.

From the k different linear combinations of the test response values output by the scan paths in one macro clock cycle, the faulty scan cells in the corresponding scan chains can then be diagnosed in accordance with the error-correcting codes used (and the register structure) of the compactor.

FIG. 5 shows a test apparatus with a CUT 92 which has 6 scan paths $S_1$ 921, ..., $S_6$ 926, and a compactor 93. The compactor 93 consists of the controllable elements 98$i$, the XOR elements 94$i$ and the AND gate 96.

A controllable element 98$i$ consists of a flip-flop and a preceding multiplexer with two data inputs and one output and the control signal $v_i$. The following flip-flop is implemented, for example, as a scan flip-flop.

For j=1, ..., 5, the output of the controllable element 98$i$ is connected to the second input of the XOR element 94(i+1) and, at the same time, to the first data input of the element 98 (i+1). The output of the scan path $S_i$ 92$i$ is connected to the first input of the XOR element 94$j$ for j=1, ..., 6, the output of which is connected to the second data input of the controllable element 98$i$.

The output of the controllable element 986 is connected at the same time to the output 97 of the compactor 93 and to the first input of the AND gate 96. At the second input of the AND gate 96, the control signal v for disconnecting the feedback of the compactor 93 is present.

The output of the AND gate 96 is connected, at the same time, to the first input of the controllable element 981 and to the second input of the XOR element 941 for implementing the feedback.

In the circuit according to FIG. 5, the control signal $v_i$ of the controllable element 98$i$ determines whether it is the output value, added modulo-2 in the XOR gate 94$i$, of the scan path $S_i$ 92$i$ which is stored in the subsequent storage element 94$i$ via the multiplexer 98$i$, or the unmodified value.

For i=1, ..., 6, the occupancy of the i-th scan path $a_i$, $b_i$, $c_i$, $d_i$, $e_i$ is specified. In addition, k=4 micro clock cycles correspond to one macro clock cycle T. The data are shifted out of the scan paths $S_1$ 921, ..., $S_6$ 926 in macro clock cycles T.

Since one macro clock cycle T contains four micro clock cycles t, the scan path $S_i$ outputs the values $a_i, a_i, a_i, a_i, b_i, b_i, b_i, b_i, c_i, c_i, c_i, c_i, d_i, d_i, d_i, d_i$ in sixteen micro clock cycles 1, 2, ..., 16, which correspond to the 4 macro clock cycles 1, 2, 3, 4. These are drawn next to the scan paths in columns 1, ..., 6.

Each stored value is entered 4 times in each scan path in order to illustrate that each value shifted out of a scan path is in each case available for four micro clock cycles t.

In columns 7 and 8, the number of the micro clock cycle and the number of the macro clock cycle are specified. The macro clock cycle indicates when the data item located in the same row is shifted out of the corresponding scan path.

In columns i'=1, ..., 6, the values of the control signals $v_1$ are specified which control the multiplexers 93$i$ of the compactor 93. It can be noticed that the values of the control signals $v_i$ are periodic, with the period k=4, and can be easily implemented by a modulo-k counter with k=4 and, for example, a ROM.

At the output 97 of the compactor 93, the compacted value y[t] is output in each micro clock cycle t and compared with the correct value y[t,ko] at selected times of the micro clock cycle.

The case is firstly described where an evaluating device compares the output y[t] of the compactor with the correct value y[t,ko], provided by the tester, in every fourth micro clock cycle 1, 5, 9, 12, .... The control signals $v_i$ of the controllable elements 98$i$, which are represented in columns i of FIG. 5 for the different micro clock cycles, are all equal to 1 for the "diagonals" $D_6, D_{10}, D_{14}, D_{18}$.

For this reason, the compactor 93 outputs at its output 97 in micro clock cycles 6, 10, 14, 18 the following:

$$D_6: y[6] = a_1 \oplus a_2 \oplus a_3 \oplus a_4 \oplus b_5 \oplus b_6$$

$$D_{10}: y[10] = b_1 \oplus b_2 \oplus b_3 \oplus b_4 \oplus c_5 \oplus c_6$$

$$D_{14}: y[14] = c_1 \oplus c_2 \oplus c_3 \oplus c_4 \oplus d_5 \oplus d_6$$

$$D_{18}: y[18] = d_1 \oplus d_2 \oplus d_3 \oplus d_4 \oplus e_5 \oplus e_6$$

if the control signal v of the AND gate 96 is equal to 0 and the feedback is thus interrupted. Parity is formed over all values in the storage cells.

If the tester has noticed a deviation, i.e. an error, during the comparison of, for example, the values y[6] and y[6,ko] by the tester, the location of the error can subsequently be determined in the following manner. In micro clock cycles 6, 7, 8 and 9 of the macro clock cycle t, the following values are output at the output 97 of the compactor 93:

$$D_6: y[6] = a_1 \oplus a_2 \oplus a_3 \oplus a_4 \oplus b_5 \oplus b_6$$

$$D_7: y[7] = a_2 \oplus a_3 \oplus b_4 \oplus b_5$$

$$D_8: y[8] = a_1 \oplus a_2 \oplus b_3 \oplus b_4 \oplus b_6$$

$$D_9: y[9] = a_1 \oplus b_2 \oplus b_3 \oplus b_4 \oplus b_5$$

Each of the errors in one of the storage cells, $a_1, a_2, a_3, a_4$, $b_4, b_5, b_6$, the values of which are included in the calculation of y[t], leads to another error pattern.

If, for example, $a_1$ is disturbed to become $\bar{a}_1$, the comparison of the values y[6] and y[6,ko], y[8] and y[8,ko], y[9] and y[9,ko] will produce a difference and the comparison of the values y[7] and y[7,ko] will not produce a difference, which is expressed by an error syndrome 1,0,1,1. A 1 in a syndrome specifies a difference of the compared values and a 0 specifies a match of the compared values.

If, for example, $a_2$ is disturbed to become $\bar{a}_2$, the comparison of the values y[6] and y[6,ko], y[7] and y[7,ko], y[8] and y[8,ko] will produce a difference and the comparison of the values y[9] and y[9,ko] will not produce a difference, which is expressed by an error syndrome 1,1,1,0.

If, for example, $b_4$ is disturbed to become $\bar{b}_4$, the comparison of the values y[7] and y[7,ko], y[8] and y[8,ko], y[9] and y[9,ko] will produce a difference and the comparison of the values y[6] and y[6,ko] will not produce a difference, which is expressed by an error syndrome 0,1,1,1.

Correspondingly, each individual error in the content of a storage cell leads to a different error syndrome. Firstly, an error is detected during the comparison of one or more of the values y[6], y[10], y[14], y[18] with the correct values provided by the tester y[6,ko], y[10,ko], y[14,ko], y[18,ko]. If an error has occurred, e.g., during the comparison of y[6] with y[6,ko], the error can be located or diagnosed by evaluating the following values y[7], y[8], y[9] output by the tester in micro clock cycles 7, 8, 9.

Thus, for example, these values output by the compactor in the successive micro clock cycles are temporarily stored in a shift register or a buffer and read out only when an error has been noticed during the comparison of the value y[6] with y[6,ko]. These temporarily stored values can also be stored, for example, in a RAM on the chip, read out to an external storage medium and evaluated after the conclusion of the test. In comparison with the methods according to the abovementioned article "*Diagnosis of Scan Chains by Use of Configurable Signature Registers and Error Correcting Codes*", the diagnostic process can be considerably accelerated because no multiple test runs with the same test input signals are required.

In the micro clock cycles in which the control signal v of the AND gate 96 is equal to 1, a signature is accumulated in the compactor 93. This signature is then compared with a correct signature at the end of the test under consideration.

Figure 6:
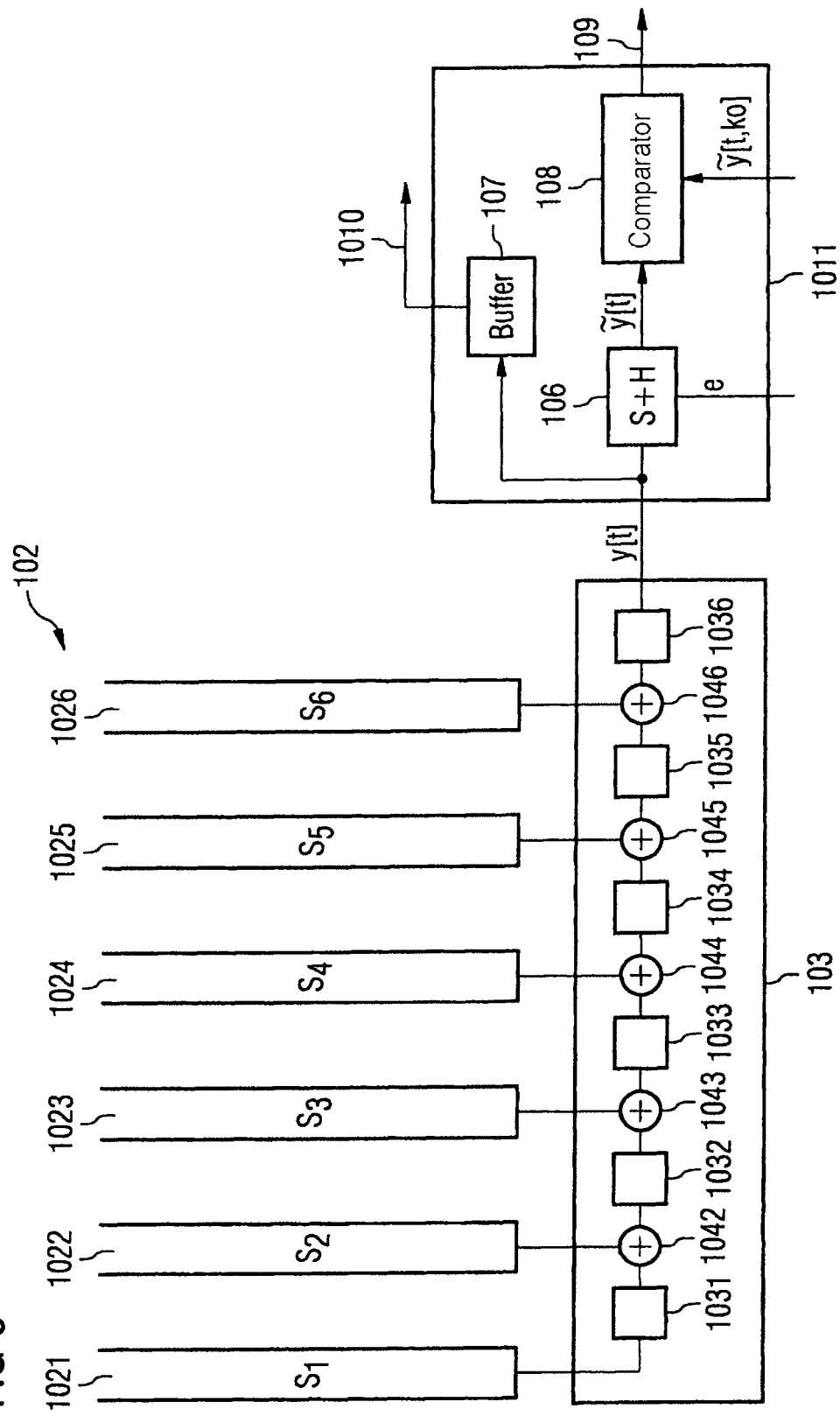
FIG. 6 depicts sections from a test apparatus according to the invention with an evaluating device.

In FIG. 6, an embodiment of the CUT 102, of the compactor 103 and of the evaluating device 1011 is shown. The CUT 102 contains 6 scan paths $S_1, \ldots, S_6$, the outputs of which are compacted in a compactor 103. This compactor 103 is followed by a sample-and-hold element 106, a buffer 107 and a comparator 108.

The compactor 103 includes 6 flip-flops 103$i$, with i= 1, ..., 6, and 5 XOR elements 104$j$, with j=2, ..., 6. The output of the scan path $S_1$ 1021 is connected to the input of the flip-flop 1031. For i=2, ..., 6, the output of the scan path $S_i$ is connected to the second input of the XOR element 104$i$, the output of which is connected to the input of the flip-flop 103$i$. The output of the flip-flop 103(i−1) is connected to the first input of the XOR element 104$i$.

The output of the flip-flop 1036, which carries the value y[t], is the output of the compactor 103. This output is connected at the same time to the input of the sample-and-hold element 106, also called S+H element, and to the input of a buffer 107. The output of the buffer 107 is the output 1010.

The output of the S+H element 106 is connected via line ỹ[t] to the first input of the comparator 108. At the second input of the comparator 108, the correct value ỹ[t,ko] is present.

The test response data, which are stored in the scan cells of the scan paths 1021, ..., 1026, are shifted out in the macro clock cycle T. These data are compacted by the compactor 103 in the micro clock cycle t. It is assumed that k*l=L, with k=4.

The compactor 103 outputs at its output a compacted signal y[t] in each micro clock cycle. This signal y[t] is input at the same time into the S+H element 106 and into the buffer 107. For example, the control signal e of the S+H element 106 can be selected to be periodic with the period k=4 for a clock cycle equal to 1 and for three clock cycles equal to 0 so that the signal e is equal to 1 in micro clock cycles 1,5,9,13, ... and equal to 0 in micro clock cycles 2,3,4,6,7,8,9,10,11,12, 14, ...

In this example, the output signal ỹ[t] is equal in each case in 4 successive micro clock cycles, corresponding to one macro clock cycle.

The following thus applies:

$$\tilde{y}[1]=\tilde{y}[2]=\tilde{y}[3]=\tilde{y}[4]=\tilde{y}[1],$$

$$\tilde{y}[5]=\tilde{y}[6]=\tilde{y}[7]=\tilde{y}[8]=\tilde{y}[5],$$

$$\tilde{y}[9]=\tilde{y}[10]=\tilde{y}[11]=\tilde{y}[12]=\tilde{y}[9],$$

Each successive k output value y[t] of the compactor 103 is also input into the buffer 107 and stored. The correct value ỹ[t,ko] is input into the comparator 108. The value for ỹ[t] is in each case equal for k=4 successive micro clock cycles or one macro clock cycle.

The signal values ỹ[t,ko] and ỹ[t] are compared in the comparator 108. If the comparator 108 indicates a difference, i.e. an error, at its output 109, the content of the buffer 107 is read out at its output 1010. The output 1010 can be both serial and parallel, e.g. with a parallelism of k.

Similarly, a parallel output of the different linear combinations of the compacted test response data by a compactor having the output word width k is used. It is only when an error has been found at the l outputs, l in most cases equal to 1, in the values output in one macro clock cycle that the data required for the diagnostic analysis are evaluated.

Individual X values can be tolerated by the proposed circuit due to the fact that a number of or all outputs are checked for the macro clock cycles affected, possibly by slowing down the macro clock frequency.

By providing a memory, it is not necessary to repeat the input of the test input signals for the diagnostic analysis. Similarly, demand on the tester during the test is not great since it only needs to evaluate l, in most cases l=1, data items per macro clock cycle. These data items can be additionally held stable at the output during the test, e.g. by means of a sample-and-hold circuit, in order to generate low signal frequencies.

The S+H element 106 can be driven and the comparison values ỹ[t] can be provided directly via a chip pad or by a control circuit integrated on the chip.

Figure 7:
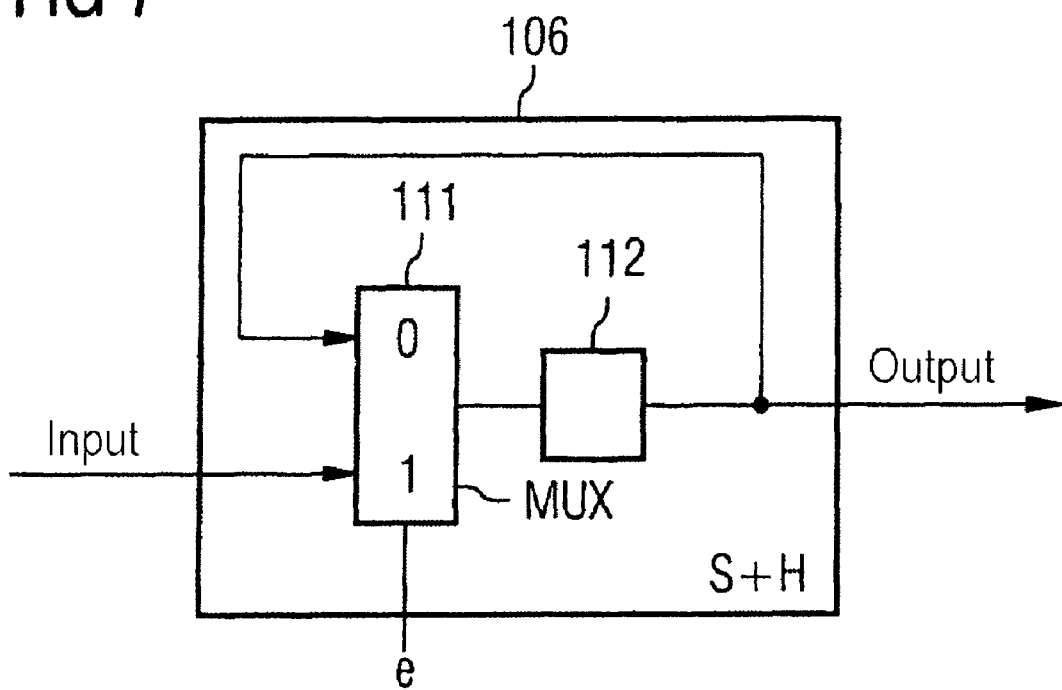
FIG. 7 depicts details of the evaluating device of FIG. 6.

FIG. 7 shows an actual embodiment of the S+H element 106. The S+H element 106 includes a multiplexer 111 and a flip-flop 112. The input of the S+H element 106 is connected to the 1 input of the multiplexer 111. The output of the multiplexer 111 is connected to the input of the flip-flop 112. The output of the flip-flop 112 is connected at the same time to the 0 input of the multiplexer 111 and to the output of the S+H element 106. The multiplexer 111 is controlled by a binary control variable e.

If the multiplexer 111 connects its 1 input to its output, a value present at the input of the S+H element 106 is conducted via the flip-flop 112, that is to say with one clock cycle delay, to the output of the S+H element 113. If the multiplexer 111 connects its 0 input to its output, the value stored in the flip-flop 112 does not change because the output of the flip-flop 112 is fed back to its input via the multiplexer 111. The value stored in the flip-flop 112 is held at the output of the S+H element 106.

The value of the binary control variable e thus determines whether the value stored in the flip-flop 112 is held at the output of the S+H element 106 or whether the value present at the input of the S+H element 106 is output with one clock cycle delay at the output of the S+H element 106.

Figure 8:
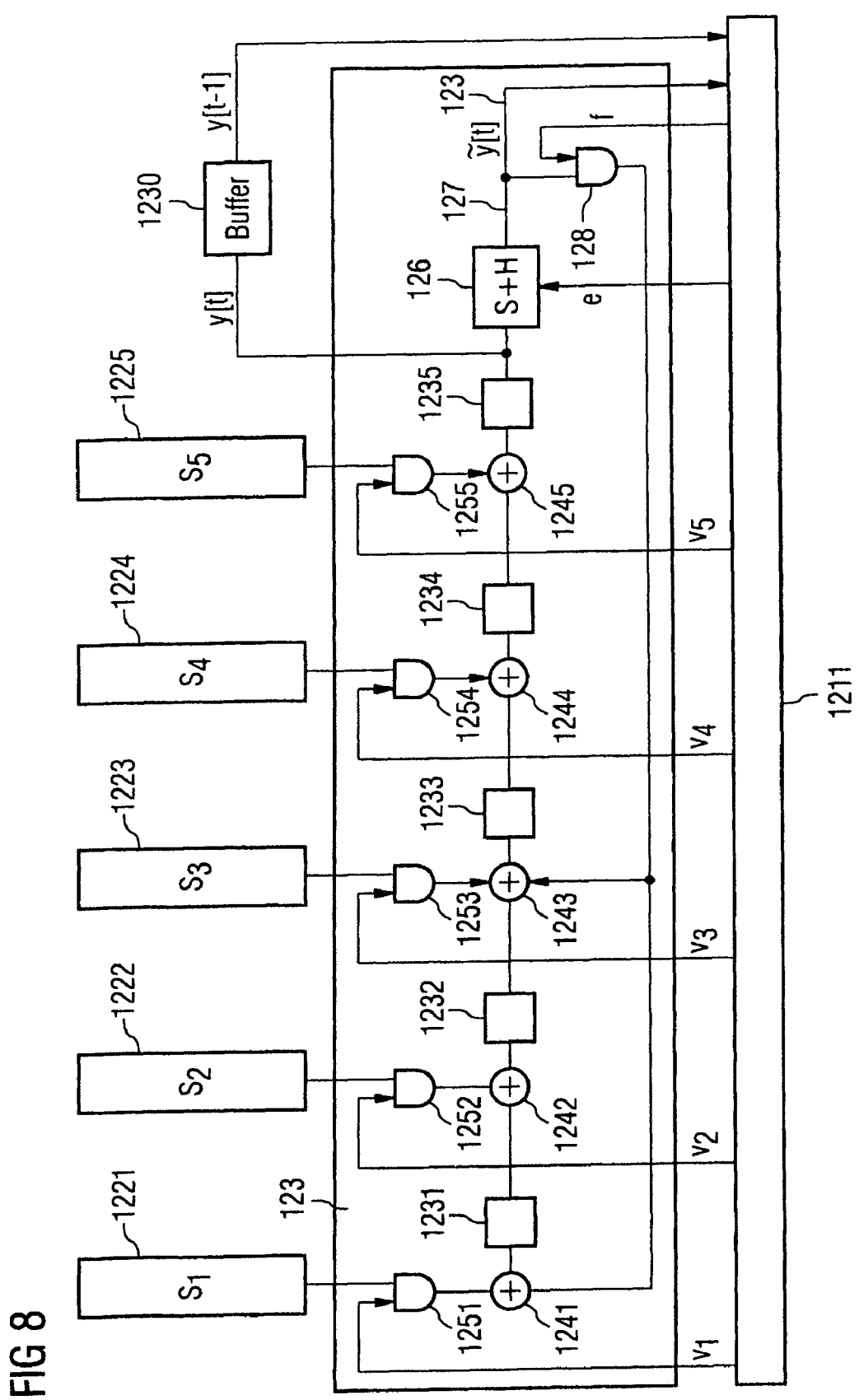
FIG. 8 depicts a further embodiment of a test apparatus with an evaluating device according to the invention.

FIG. 8 shows a further embodiment of the CUT 122, which includes 5 scan paths $S_1, \ldots, S_5$, 1221, ..., 1225. FIG. 8 also shows details of the compactor 123 and of the evaluating device 1211.

The compactor 123 includes 5 flip-flops 123i, 5 AND gates 125i, a further AND gate 128 with two inputs and one output, 5 XOR elements 1241, 1242, 1243, 1244, 1245, and a sample-and-hold element 126. The variable i runs from 1 to 5.

The XOR gates 1241, 1242, 1244, 1245 include two inputs and one output. The XOR gate 1243 includes three inputs and one output. It can be implemented, for example, by two XOR gates with two inputs and one output each.

The evaluating device 1211 generates control signals and, via the control signals generated by it, selects the values which are accumulated in the compactor 123 and compared with the correct error-free signals of the error detection circuit. An accumulated signature of the compactor is compared with selected output values of the compactor. Signals are temporarily stored in a buffer 1230 and evaluated for diagnostic analysis.

The evaluating device 1211 generates the control signals $v_1, \ldots, v_5$ for the AND gates $1251, \ldots, 1255$, the control signal f for the AND gate 128 and the control signal e for the S+H element 126. The evaluating device 1211 compares the signature generated by the compactor 125 with the expected correct signature.

The signal $\tilde{y}[t]$, output by the S+H element 126, is compared with the expected correct signal $\tilde{y}[t,ko]$, and the values $y[t-T]$, output delayed by the buffer, are compared with the expected correct values $y[t-T,ko]$.

For $i=2, \ldots, 5$, the output of the scan path $S_i$ 122i is connected to the first input of the AND gate 125i. The control signal $v_i$, which is generated by the evaluating device 1211, is conducted into the second input of the AND gate 125i. The output of the AND gate 125i is connected to the second input of the XOR element 124i, the output of which is conducted into the input of the flip-flop 123i.

For $j=2, \ldots, 5$, the output of the flip-flop 123(j-1) is connected to the first input of the XOR gate 124j. The output of the flip-flop element 1235 is connected to the input of the S+H element 126. The output 127 of the S+H element 126 is connected, at the same time, to an input of the evaluating device 1243 and to the first input of the AND gate 128, at the first input of which the signal f is present. The output of the AND gate 128 is connected to the first input of the XOR element 1241 and to the third input of the XOR element 1243. The control input of the S+H element 126 carries the control variable e which is generated by the evaluating device.

The output of the scan path $S_1$ 1221 is connected to the first input of the AND gate 1251, into the second input of which the control signal $v_1$ is conducted. The control signal $v_1$ is generated by the evaluating device 1211. The output of the AND gate 1251 is connected to the second input of the XOR element 1241, the output of which is connected to the input of the flip-flop 1231.

The test input signal generator, which is not drawn in FIG. 8, generates the test input signals which are shifted into the scan paths $S_1, \ldots, S_5$ $1221, \ldots, 1225$. The test input signals shifted in are applied to the combinatorial circuit section of the circuit which is also not drawn.

The test responses are stored in the scan cells of the scan paths $S_1, \ldots, S_5$ $1221, \ldots, 1225$, shifted out of these scan paths in macro clock cycles of length L and compacted in the compactor 125 in micro clock cycles of length l. It is assumed that $k*l=L$ and $k=4$ applies. For $i=1, \ldots, 5$, the evaluating device 1211 outputs the control signal $v_i(t)=1$ in the micro clock cycles t in which no indeterminate value is shifted out in the corresponding macro clock cycle by the scan path $S_i$. The evaluating device outputs $v_i(t)=0$ when an indeterminate value is shifted out in the corresponding macro clock cycle in micro clock cycle t by the scan path $S_i$. The evaluating device 1211 outputs the control signals $e(t)=1$ and $f(t)=1$.

From the output of flip-flop 1245 the compacted value y[t] is input into the S+H element 126 and into the buffer 1230. Since the control signal of the S+H element 125 is equal to 1, it outputs its input value delayed by one clock cycle but otherwise unchanged at its output so that $\tilde{y}[t]=y[t-1]$. Since the control signal f of the AND gate 128 is equal to 1, the output of the S+H element 126 is fed back to the XOR elements 1241 and 1243 via the AND gate 128. The compactor 125 operates as a shift register with linear feedback in the micro clock cycle of length l and accumulates a state, which is called a signature, in flip-flops 1231, 1232, 1233, 1234, 1235.

At the end of the test, this state, i.e. the signature, is input into the evaluating device 1211 via the line 1231 and compared with an expected correct signature.

If the signature actually obtained does not match the expected signature, a second run is begun for the diagnostic analysis. The control signal f of the AND gate 128 is then set equal to 0 so that the feedback of the compactor 103 is now interrupted.

The control signals $v_1, v_2, v_3, v_4$ and $v_5$ are then generated periodically with the period $k=4$ by the evaluating device 1211. The actual specification of the values of the periodic control signals has already been described in the description of the circuit shown in FIG. 4 and will not be repeated again here. The control signal e of the S+H element 126 is determined periodically as $1000, 1000, \ldots$ by the evaluating device 1211. At the output of the flip-flop element 1255, the signal y[t] is output which is input at the same time into the buffer 1230 and into the S+H element 126.

At the output of the S+H element 126, the signal $\tilde{y}[t]$ is output which assumes the same value in in each case $k=4$ successive micro clock cycles. This signal is input into the evaluating device 1211 via the line 127 and compared with the expected correct value y[t,ko]. If a deviation is found, the values stored in the buffer 1230 are evaluated in the evaluating device 1211. At the output of the buffer 1230, the values stored in the buffer, delayed by T but otherwise unchanged, are output and evaluated for diagnostic analysis in the evaluating device 1211.

In summary, the linear compactor is operated at a micro clock rate t which is faster in comparison with the clock rate T of the scan shift and the input control signals in the faster micro clock cycle t are selected in such a manner that a required high test resolution is achieved.

In particular, in the case of an error indicated in the test, the input control signals are selected in such a manner that the error can be diagnosed immediately without having to enlarge the output word width of the compactor and without the test input data having to be input again into the circuit to be tested by the test input generator or tester.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A test apparatus for an electrical circuit to be tested, the test apparatus comprising:
a test input signal generator configured to generate a test input signal of word width N;

terminals that connect to inputs and outputs of an electrical circuit to be tested, wherein the electrical circuit to be tested includes N digital test inputs and M digital test outputs, the terminals that connect to the test inputs are connected to receive the test input signal, and the electrical circuit is driven such that the electrical circuit outputs data with a macro clock cycle T of period L as a test response;

a compactor including M inputs that are connected to the outputs of the electrical circuit to receive the test response;

wherein the compactor is configured to compact the test response with a micro clock cycle t of period l and to output the test response as a data word of width m, where m is smaller than M and the period L is at least twice as large as the period l; and an evaluating device that is configured to:
 select signals that are output by the compactor and compare the output signals of the compactor with result values corresponding with an error-free circuit, wherein the evaluating device compares a first part of the output signals of the compactor with the result values and stores a further part of the output signals of the compactor; and
 in response to the evaluating device determining by a comparison that errors are present in the output signals of the compactor, use the further part of the output signals of the compactor for diagnostic analysis of the errors.

2. The test apparatus of claim 1, wherein the evaluating device is further configured to compare a subset of the output signals of the compactor with the result values.

3. The test apparatus of claim 1, wherein the evaluating device is further configured to compare only output signals of the compactor with expected values that are not influenced by unknown values in the electrical circuit.

4. The test apparatus of claim 1, wherein the last K compacted output signals of the compactor are stored and evaluated by the evaluating device when at least one error has occurred during the comparison of the output values of the compactor with corresponding correct expected compacted values of the result values, the comparison is made at micro clock cycles that are determined by the evaluating device, and K is greater than or equal to 2.

5. The test apparatus of claim 1, wherein the compactor comprises a linear automaton.

6. The test apparatus of claim 5, wherein the linear automaton is time-variable.

7. The test apparatus of claim 5, wherein the compactor includes multi-input shift registers.

8. The test apparatus of claim 5, wherein the compactor includes multi-input linear feedback registers.

9. The test apparatus of claim 1, wherein at least one scan path is connected between the inputs and the outputs of the electrical circuit.

10. The test apparatus of claim 1, wherein the evaluating device and the electrical circuit are at least partially integrated in a semiconductor component.

11. The test apparatus of claim 1, wherein the evaluating device is at least partially disposed in a tester.

12. A method for testing and for diagnosing an electrical circuit, comprising:
 (a) generating a test input signal with a word width N;
 (b) applying the test input signal to an electrical circuit to be tested, and operating the electrical circuit in a test mode so that the electrical circuit outputs at test outputs of the electrical circuit data words with a word width M in a macro clock cycle T of period L as a test response;
 (c) compacting the test response output in step (b) to m compacted output signals in a micro clock cycle t with period l, where m is smaller than M and the period L is at least twice as large as the period l;
 (d) comparing selected compacted output signals with result values corresponding with an error-free circuit, wherein the comparing comprises comparing a first part of the selected compacted output signals with the result values and storing a further part of the selected compacted output signals of the compactor; and
 (e) in response to determining by the comparison of step (d) that errors are present in the selected compacted output signals, using the further part of the selected compacted output signals for diagnostic analysis of the errors.

13. The method of claim 12, wherein, in step (d), the selected compacted output signals are sampled with a clock cycle which is longer than the period l of the micro clock cycle t and are compared with the result values corresponding with an error-free circuit.

14. The method of claim 13, wherein the test mode in step (b) is a scan test mode.

15. A computer memory containing at least a computer program, wherein the computer program includes instructions that are configured to:
 (a) generate a test input signal with a word width N;
 (b) apply the test input signal to an electrical circuit to be tested, and operate the electrical circuit in a test mode so that the electrical circuit outputs at test outputs of the electrical circuit data words with a word width M in a macro clock cycle T of period L as a test response;
 (c) compact the test response output in step (b) to m compacted output signals in a micro clock cycle t with period l, where m is smaller than M and the period L is at least twice as large as the period l;
 (d) compare selected compacted output signals with result values corresponding with an error-free circuit, wherein the comparing comprises comparing a first part of the selected compacted output signals with the result values and storing a further part of the selected compacted output signals; and
 (e) in response to determining by the comparison of step (d) that errors are present in the selected compacted output signals, using the further part of the selected compacted output signals for diagnostic analysis of the errors.

16. A method for designing a test apparatus for testing an electrical circuit, comprising:
 providing a test input signal generator that generates a test input signal of word width N and terminals that connect to inputs and outputs of the electrical circuit to be tested, wherein the electrical circuit includes N digital test inputs and M digital test outputs, and the terminals that connect to the test inputs of the electrical circuit are connected to receive the test input signal;
 providing a micro clock cycle t of period l and a synchronized macro clock cycle T of period L, where L is at least twice as large as l, wherein the electrical circuit is driven such that the electrical circuit outputs data with the macro clock cycle T of period L as a test response;
 providing a compactor including M inputs that are connected to the outputs of the electrical circuit to receive the test response from the electrical circuit, compact the test response with the micro clock cycle t of period l and output the test response as a data word of width m, where m is smaller than M; and
 providing an evaluating device to:
 select signals that are output by the compactor and compare the output signals of the compactor with result values corresponding with an error-free circuit, wherein the evaluating device compares a first part of the output signals of the compactor with the result values and stores a further part of the output signals of the compactor; and in response to the evaluating device determining by a comparison that errors are present in the output signals of the compactor, use the further part of the output signals of the compactor for diagnostic analysis of the errors.

* * * * *